United States Patent
Kobayakawa et al.

(10) Patent No.: US 8,148,745 B2
(45) Date of Patent: Apr. 3, 2012

(54) SEMICONDUCTOR LIGHT EMITTING MODULE AND METHOD FOR MANUFACTURING THE SAME

(75) Inventors: Masahiko Kobayakawa, Kyoto (JP); Shintaro Yasuda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 396 days.

(21) Appl. No.: 12/412,977

(22) Filed: Mar. 27, 2009

(65) Prior Publication Data
US 2009/0242927 A1    Oct. 1, 2009

(30) Foreign Application Priority Data

Mar. 28, 2008  (JP) ................................. 2008-087124
Sep. 16, 2008  (JP) ................................. 2008-236996

(51) Int. Cl.
*H01L 33/00*   (2010.01)

(52) U.S. Cl. ... 257/99; 257/100; 257/684; 257/E33.056; 257/E33.057; 257/E33.058; 257/79; 257/E23.059; 438/25; 438/26; 438/106; 438/123

(58) Field of Classification Search ............ 257/81, 257/99, E33.056, E33.057, E33.058, E33.059, 257/79, 100, 684; 438/23, 24, 25, 26, 106, 438/123
See application file for complete search history.

(56) References Cited

U.S. PATENT DOCUMENTS 6,486,543 B1 *  11/2002  Sano et al. ...................... 257/684
7,528,414 B2 *   5/2009  Huang et al. ...................... 257/79

FOREIGN PATENT DOCUMENTS

JP   2006253551   *   3/2005
JP   2006-253551  *   9/2006

* cited by examiner

*Primary Examiner* — A. Sefer
*Assistant Examiner* — Farid Khan
(74) *Attorney, Agent, or Firm* — Hamre, Schumann, Mueller & Larson, P.C.

(57) ABSTRACT

A light emitting module includes a semiconductor light source, a first lead with a bonding pad to which the light source is attached, and a second lead spaced from the first lead in a first direction contained in the plane of the first die bonding pad. The second lead includes a wire bonding pad connected to the light source via a wire. The module also includes a case formed with a space elongated in the first direction for accommodating the light source. The first lead includes an extension extending from the first die bonding pad, and a mounting terminal connected to the extension. The extension extends in a second direction that is perpendicular to the first direction and contained in the plane of the first die bonding pad. The mounting terminal extends perpendicularly to the second direction. The extension overlaps the light source in the first direction.

11 Claims, 7 Drawing Sheets

SEMICONDUCTOR LIGHT EMITTING MODULE AND METHOD FOR MANUFACTURING THE SAME

BACKGROUND OF THE INVENTION

1. Field of the Invention

The present invention relates to a semiconductor light emitting module and a method for manufacturing such a semiconductor light emitting module.

2. Description of the Related Art

FIGS. 8 and 9 show an example of conventional semiconductor light emitting module (see JP-A-2006-253551, for example). The semiconductor light emitting module shown in the figure includes leads 91A and 91B, an LED chip 92, a case 93 and sealing resin 94 and is designed as a side-view-type semiconductor light emitting module. The leads 91A and 91B are in the form of a plate made of an alloy such as Cu-alloy or Ni-alloy plated with Ag. The LED chip 92 is mounted on the lead 91A. For instance, the LED chip 92 emits blue light. The LED chip 92 is connected to the lead 91B via a wire 95. The case 93 is made of e. g. a white resin and covers the LED chip 92. The leads 91A and 91B partially project out of the case 93. The projecting portions provide mounting terminals 91Aa and 91Ba. The space in the case 93 is filled with the sealing resin 94. The sealing resin 94 may comprise a transparent resin in which a fluorescent material is mixed. The fluorescent material is excited by the light emitted from the LED chip 92 to emit e.g. yellow light. The yellow light from the sealing resin 94 is mixed with the blue light emitted from the LED chip 92, whereby white light is emitted from the semiconductor light emitting module X.

With this arrangement, the amount of heat generated at the LED chip 92 increases as the brightness of the semiconductor light emitting module X is increased. Thus, when the heat is not sufficiently dissipated, the LED chip 92 is excessively heated or the quality of the sealing resin 94 changes.

SUMMARY OF THE INVENTION

The present invention has been proposed under the circumstances described above. It is, therefore, an object of the present invention to provide a semiconductor light emitting module capable of increasing the brightness. Another object of the present invention is to provide a method for manufacturing such a semiconductor light emitting module.

According to a first aspect of the present invention, there is provided a semiconductor light emitting module comprising: a semiconductor light emitting element; a first lead including a first die bonding pad to which the semiconductor light emitting element is attached; a second lead spaced from the first lead in a first direction contained in a plane of the first die bonding pad, the second lead including a wire bonding pad connected to the semiconductor light emitting element via a wire; and a case formed with a space elongated in the first direction and accommodating the semiconductor light emitting element. The first lead is provided with an extension extending from the first die bonding pad and with a mounting terminal connected to the extension, where the extension extends in a second direction perpendicular to the first direction and contained in the plane of the first die bonding pad. The mounting terminal extends perpendicularly to the second direction. The extension overlaps the semiconductor light emitting element in the first direction.

Preferably, the semiconductor light emitting module of the first aspect may further comprise a zener diode. In addition, the first lead may include a second die bonding pad extending from the first die bonding pad in the first direction toward the second lead and located at a position deviated toward an end of the space in the second direction, where the zener diode is attached to the second die bonding pad. The wire bonding pad of the second lead may be located at a position deviated toward another end of the space in the second direction and may overlap the second die bonding pad in the first direction.

Preferably, the semiconductor light emitting module of the first aspect may further comprise a plating layer covering an end surface of the mounting terminal and having a higher solder wettability than the mounting terminal. The end surface of the mounting terminal may face in a third direction perpendicular to both the first direction and the second direction.

Preferably, the case may include a holding surface opposite to the mounting terminal in the second direction and extending in parallel with the mounting terminal.

Preferably, the space may include a wider portion accommodating the semiconductor light emitting element and two narrower portions sandwiching the wider portion in the first direction, where the narrower portions are smaller than the wider portion in dimension in the second direction. A portion of the case on the mounting terminal side may have a non-flat side surface defining the wider portion and the two narrower portions, whereas a portion of the case on the opposite side of the mounting terminal in the second direction may have a flat surface.

Preferably, the case may include a placing surface offset in the first direction toward the second lead relative to the mounting terminal, where the placing surface is flush with the mounting terminal.

According to a second aspect of the present invention, there is provided a method for manufacturing a semiconductor light emitting module. According to the method, a lead frame is prepared, which extends in a first direction and a second direction perpendicular to the first direction. The lead frame includes a die bonding pad for bonding a semiconductor light emitting element, an extension extending from the die bonding pad in the second direction, a mounting terminal connected to the extension, and a frame portion to which the mounting terminal is connected via a connecting portion smaller than the mounting terminal in dimension in the first direction. Then, the lead frame is plated with a material having a higher solder wettability than the lead frame. Then, a semiconductor light emitting element is bonded on the die bonding pad at a position overlapping the extension in the first direction. Then, a case is formed, which includes a space elongated in the first direction for accommodating the semiconductor light emitting element. Then, the connecting portion is cut, and the extension is bent so that the mounting terminal extends perpendicularly to the second direction.

Other features and advantages of the present invention will become more apparent from detailed description given below with reference to the accompanying drawings.

DETAILED DESCRIPTION OF THE PREFERRED EMBODIMENTS

Preferred embodiments of the present invention will be described below with reference to the accompanying drawings.

Figure 1:
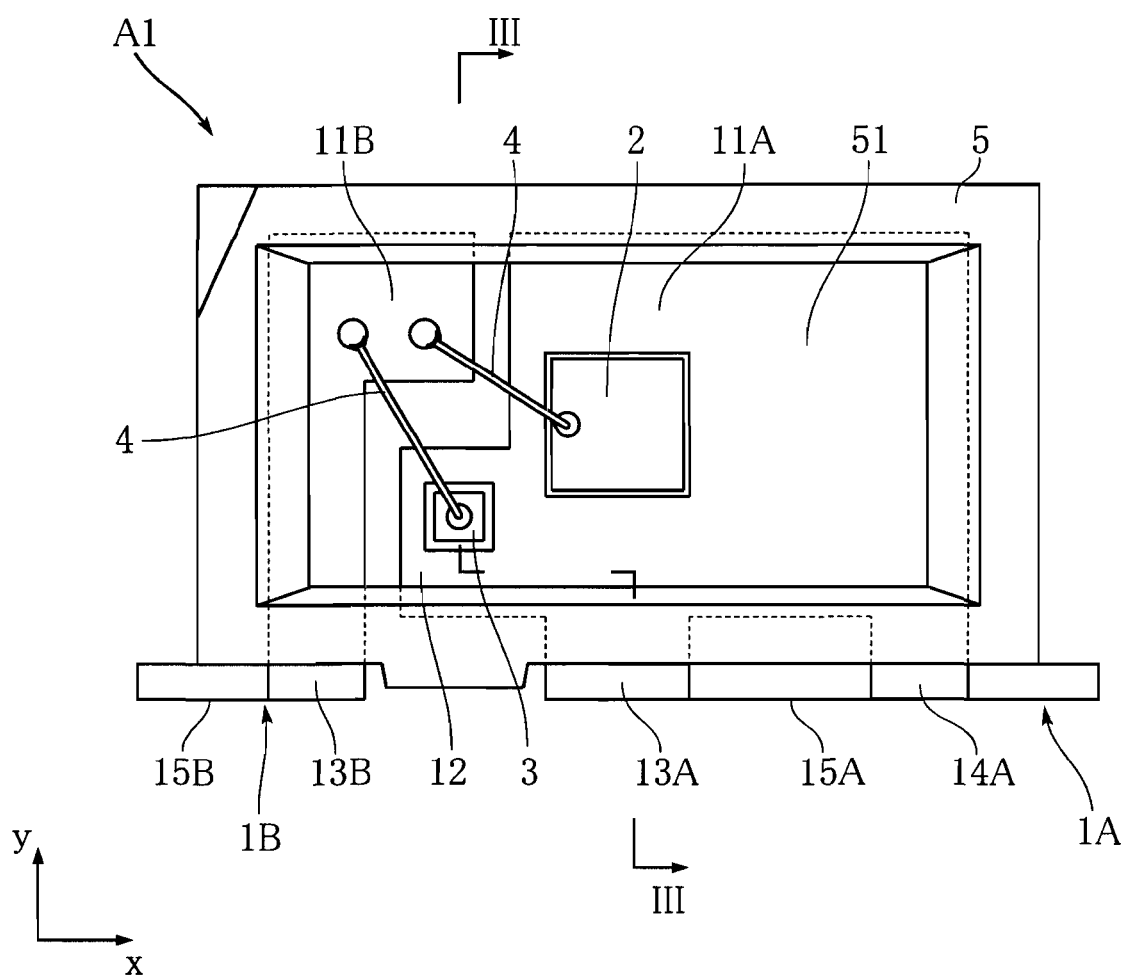
FIG. 1 is a plan view showing a semiconductor light emitting module according to a first embodiment of the present invention.
Figure 2:
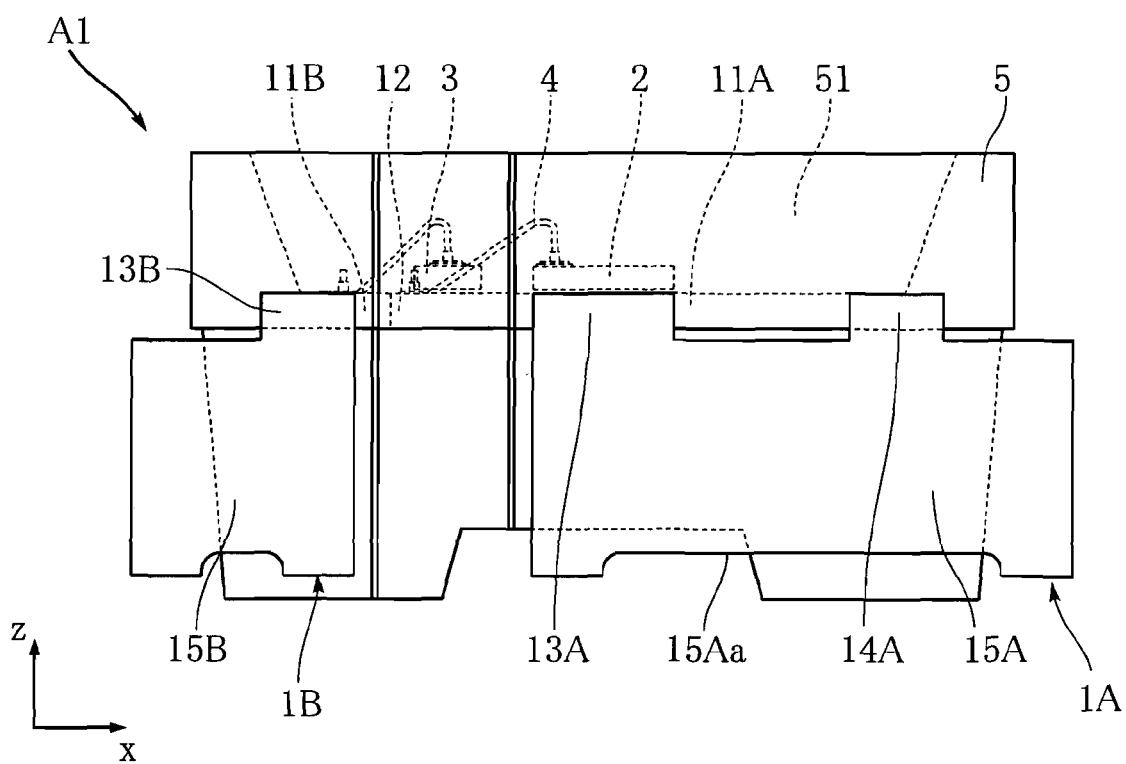
FIG. 2 is a side view showing the semiconductor light emitting module according to the first embodiment of the present invention.
Figure 3:
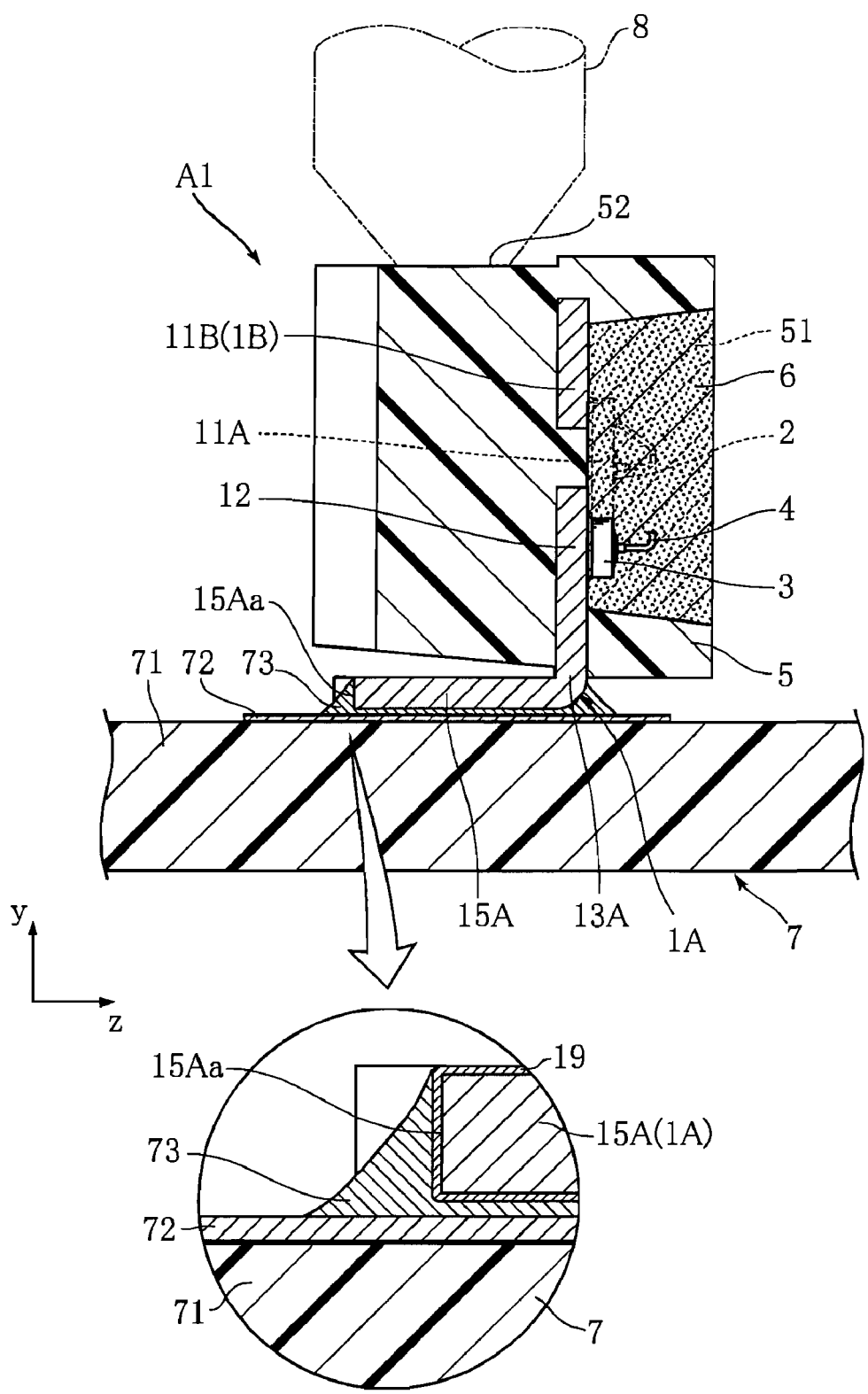
FIG. 3 is a sectional view taken along lines III-III in FIG. 1.

FIGS. 1-3 show a semiconductor light emitting module according to a first embodiment of the present invention. The semiconductor light emitting module A1 of this embodiment includes leads 1A and 1B, an LED chip 2, a zener diode 3, a case 5 and sealing resin 6. For instance, the semiconductor light emitting module A1 is designed to emit white light by mixing blue light and yellow light. The semiconductor light emitting module is designed as a side-view type and so mounted on a circuit board 7 as to emit light in the z direction, as shown in FIG. 3. For instance, the semiconductor light emitting module A1 has a length of about 3.5 mm in the x direction, a width of about 2 mm in the y direction and a height of about 2 mm in the z direction. For easier understanding, the illustration of the sealing resin 6 is omitted in FIG. 1.

The leads 1A and 1B are utilized for applying current to the LED chip 2. The leads 1A and 1B are in the form of a plate made of an alloy such as Cu-alloy or Ni-alloy plated with Ag and spaced from each other in the x direction.

The lead 1A includes a die bonding pad 11A, a die bonding pad 12, extensions 13A and 14A, and a mounting terminal 15A. The die bonding pad 11A is a relatively large portion having e.g. a rectangular shape. The LED chip 2 is mounted on the die bonding pad 11A. The zener diode 3 is mounted on the die bonding pad 12. From an end of the die bonding pad 11A in the y direction, the die bonding pad 12 extends in the x direction toward the lead 1B.

The extensions 13A and 14A extend from the die bonding pad 11A in the y direction and are spaced from each other in the x direction. The position of the extension 13A in the x direction substantially corresponds to that of the LED chip 2. Each of the extensions 13A and 14A is so bent that its one end is oriented in the z direction. The mounting terminal 15A is connected to the die bonding pad 11A via the extensions 13A and 14A. The mounting terminal 15A is a rectangular portion oriented in the y direction. As shown in FIG. 3, the mounting terminal 15A is utilized for mounting the semiconductor light emitting module A1 on e.g. a circuit board 7. In this case, the mounting terminal 15A is bonded to the wiring pattern 72 of the circuit board 7 via solder 73. The mounting terminal 15A includes an end surface 15Aa oriented in the z direction. The end surface 15Aa is covered with a plating layer 19 made of Ag. With this arrangement, the solder 73 readily adheres to the end surface 15Aa while forming a fillet.

The lead 1B includes a bonding pad 11B, an extension 13B and a mounting terminal 15B. Two wires 4 are bonded to the bonding pad 11B. One of the wires 4 is bonded, at the other end, to the LED chip 2. The other one of the wires 4 is bonded, at the other end, to the zener diode 3. In this embodiment, the bonding pad 11B and the die bonding pad 12 are spaced from each other at an appropriate distance in the y direction in a manner such that the position of the bonding pad 11B in the x direction overlaps the position of the die bonding pad 12 in the x direction (more simply, "the bonding pad 11B overlaps the die bonding pad 12 in the x direction").

The extension 13B extends from the bonding pad 11B in the y direction and is so bent that its one end is oriented in the z direction. The mounting terminal 15B is a rectangular portion oriented in the y direction and connected to the bonding pad 11B via the extension 13B. The mounting terminal 15B is utilized for mounting the semiconductor light emitting module A1 on e.g. a circuit board 7. In this case, the mounting terminal 15B is bonded to the wiring pattern 72 of the circuit board 7 via solder 73.

The LED chip 2 is the light source of the semiconductor light emitting module A1 and an example of semiconductor light emitting element in the present invention. For instance, the LED chip 2 has a laminated structure made up of an n-type semiconductor layer mainly composed of GaN, an active layer and a p-type semiconductor layer and emits blue light. The upper surface of the LED chip 2 is formed with an electrode (not shown). The electrode is connected to the bonding pad 11B via the wire 4.

The zener diode 3 prevents excessive reverse voltage from being applied to the LED chip 2 and allows the current to flow in the reverse voltage direction only when reverse voltage exceeding a predetermined value is applied. The zener diode is bonded on the die bonding pad 12 and connected to the bonding pad 11B via the wire 4.

The case 5 is made of e.g. a white resin and generally in the form of an elongated rectangular parallelepiped. The case 5 covers most part of the leads 1A and 1B. The case 5 includes a space 51 whose dimension in the x direction is larger than the dimension in the y direction. The space 51 accommodates the LED chip 2 and the zener diode 3. As shown in FIG. 3, the case 5 includes a holding surface 52. The holding surface 52 is located on the opposite side of the mounting terminal 15A in the y direction and extends in parallel with the mounting terminal 15A. The holding surface 52 is utilized for holding the semiconductor light emitting module A1. For instance, the semiconductor light emitting module A1 is held by sucking the holding surface 52 by a suction nozzle 8.

The sealing resin 6 fills the space 51 and covers the LED chip 2 and the zener diode 3. The sealing resin 6 comprises a transparent resin in which a fluorescent material is mixed. For instance, as the fluorescent material, use may be made of YAG:$Ce^{3+}$ which emits yellow light when excited by blue light.

An example of method for manufacturing the semiconductor light emitting module A1 will be described below with reference to FIGS. 4 and 5. For easier understanding, the illustration of the sealing resin 6 is omitted in these figures.

Figure 4:
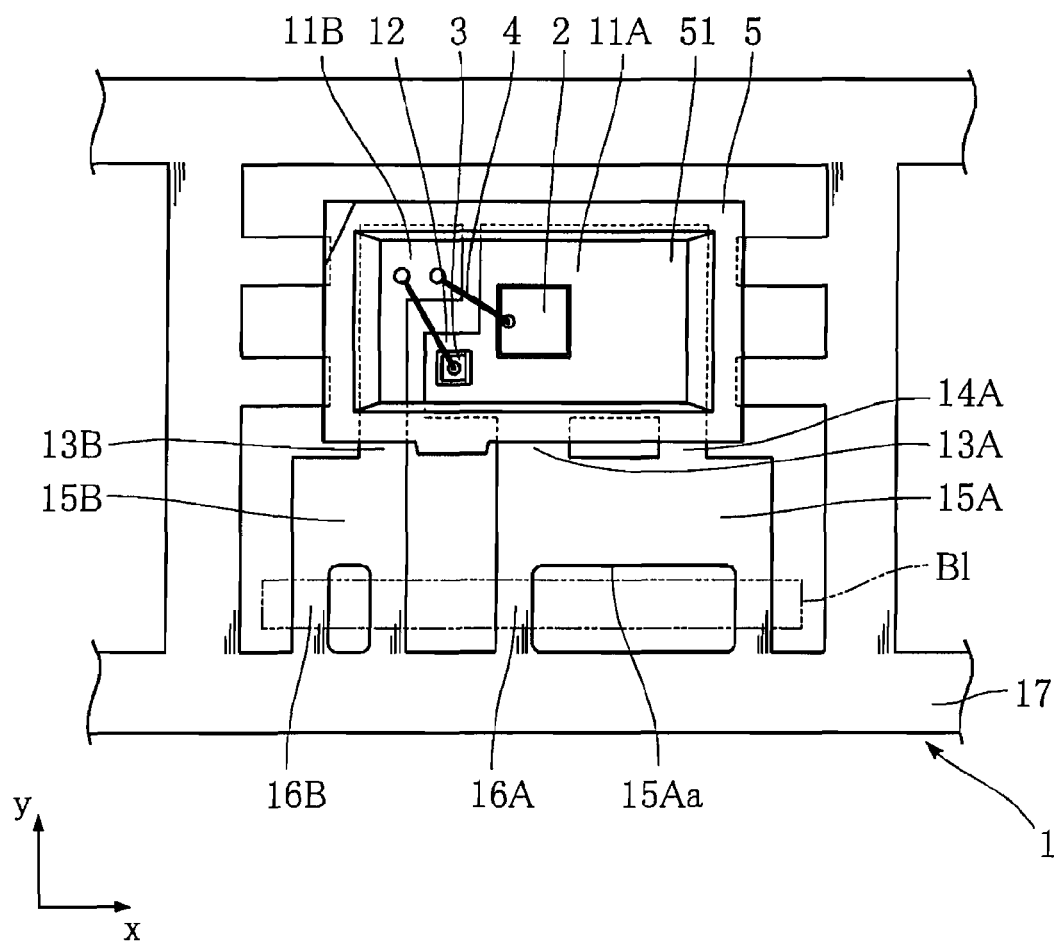
FIG. 4 is a plan view showing a lead frame on which an LED chip is mounted and a case is formed in a method for manufacturing the semiconductor light emitting module shown in FIG. 1.
Figure 5:
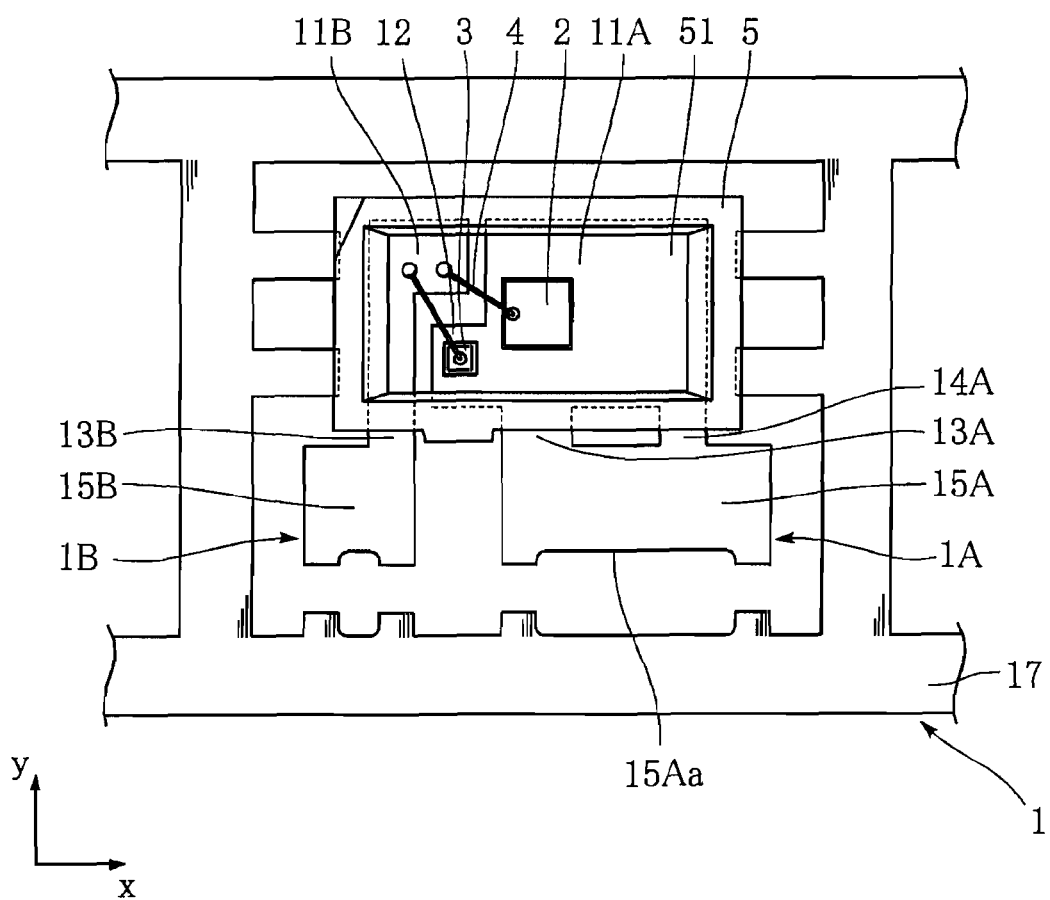
FIG. 5 is a plan view showing the step of cutting the lead frame in the method for manufacturing the semiconductor light emitting module shown in FIG. 1.

First, a lead frame 1 as shown in FIG. 4 is prepared. The lead frame 1 may be formed by punching a plate of an alloy such as Cu-alloy or Ni-alloy and then plating the plate with Ag. The lead frame 1 includes a die bonding pad 11A, a bonding pad 11B, a die bonding pad 12, extensions 13A, 13B, 14A, mounting terminals 15A, 15B, connecting portions 16A, 16B and a frame portion 17. Although the figure shows only the elements necessary for making a single semiconductor light emitting module A1, the lead frame 1 may include the elements for making a plurality of semiconductor light emitting modules A1. In this case, a plurality of semiconductor light emitting modules A1 can be formed collectively.

The die bonding pad 11A, the die bonding pad 12, the extensions 13A, 14A and the mounting terminal 15A are connected to the frame portion 17 via the two connecting portions 16A. The two connecting portions 16A extend in the y direction and are spaced from each other in the x direction. The dimension of each of the connecting portions 16A in the x direction is smaller than that of the mounting terminal 15A. The frame portion 17 is in the form of a strip extending in the x direction.

Then, a case 5 is formed on the lead frame 1 using e.g. a mold. Then, the LED chip 2 and the zener diode 3 are die-bonded, and wires 4 are bonded. Specifically, the LED chip 2 is bonded at a position substantially corresponding to the extension 13A in the x direction. Then, sealing resin 6 (not shown) is formed. Thereafter, the connecting portions 16A and 16B are cut with e.g. a blade B1. As a result, as shown in FIG. 5, the leads 1A and 1B are formed. Then, the extensions 13A, 13B and 14A are bent substantially at right angles, whereby the semiconductor light emitting module A1 as shown in FIGS. 1-3 is obtained.

The advantages of the semiconductor light emitting module A1 and its manufacturing method will be described below.

According to this embodiment, heat is transferred from the LED chip 2 to the mounting terminal 15A via the extension 13A. Since the mounting terminal 15A is bonded to the wiring pattern 72 of the circuit board 7 via the solder 73, the heat transferred to the mounting terminal 15A is dissipated to the wiring pattern 72. Thus, heat is efficiently dissipated from the LED chip 2, which makes it possible to increase the brightness of the semiconductor light emitting module A1.

In mounting the semiconductor light emitting module A1 on the circuit board 7, the mounting terminal 15A is pressed against the circuit board 7. In this process, by sucking the holding surface 52 with the suction nozzle 6, the semiconductor light emitting module A1 is pressed against the circuit board 7 in a straight posture. Thus, the semiconductor light emitting module A1 is prevented from falling over in this process.

As noted before, the end surface 15Aa is covered with the plating layer 19, which is made of Ag having a higher solder wettability than Cu or Ni. This arrangement is suitable for forming a fillet of the solder 73 and hence ensures the proper mounting of the semiconductor light emitting module A1. The end surface 15Aa is properly formed by cutting the connecting portions 16A shown in FIG. 4 using the blade B1. For instance, when the manufacture of the semiconductor light emitting module A1 is completed, the cutting surfaces of the connecting portions 16A are oriented in the z direction similarly to the end surface 15Aa. However, unlike the end surface 15Aa, the cutting surfaces are not covered with the plating layer 19, and hence, not suitable for forming a fillet of the solder 73.

In transporting or mounting the semiconductor light emitting module A1, reverse voltage due to large static electricity may be applied. However, by the provision of the zener diode 3, the LED chip 2 is prevented from breaking due to such reverse voltage. Further, by arranging the die bonding pad 12 and the bonding pad 11B in a staggered manner, the zener diode 3 and the wire 4 connected to the zener diode 3 are arranged in a relatively compact manner. This is suitable for reducing the dimension of the semiconductor light emitting module A1 in the x direction.

Figure 6:
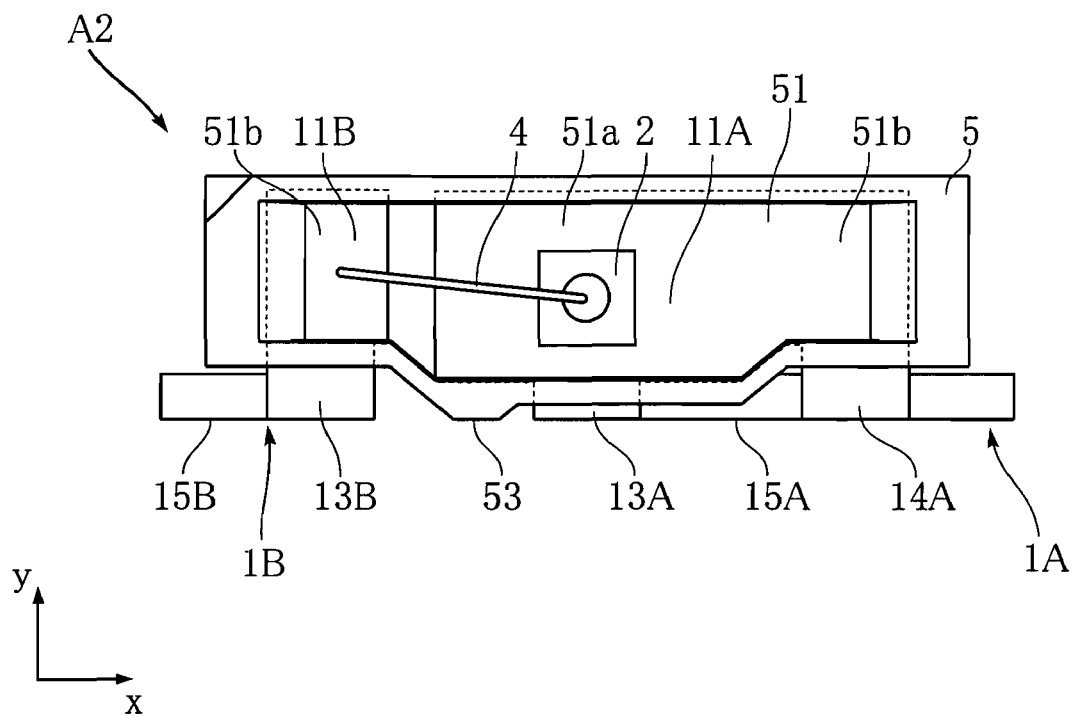
FIG. 6 is a plan view showing a semiconductor light emitting module according to a second embodiment of the present invention.
Figure 7:
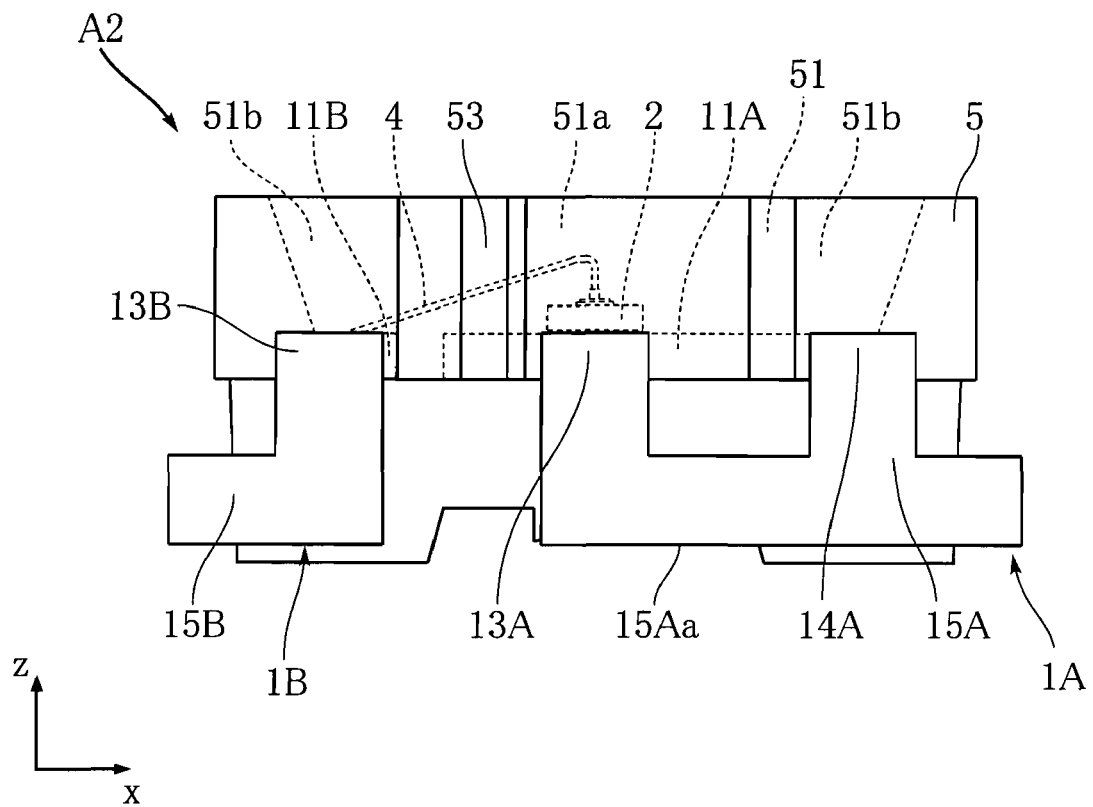
FIG. 7 is a side view showing the semiconductor light emitting module according to the second embodiment of the present invention.
Figure 8:
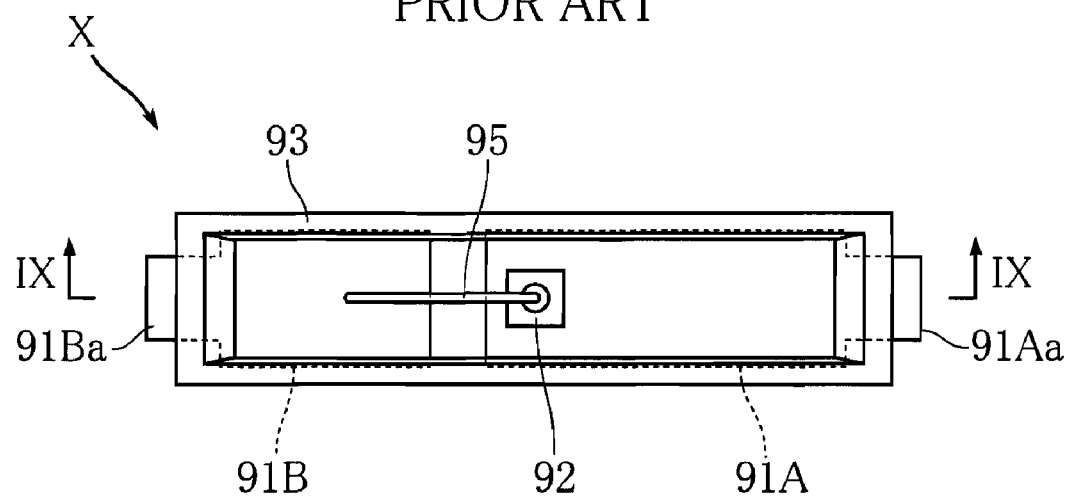
FIG. 8 is a plan view showing an example of conventional semiconductor light emitting module.
Figure 9:
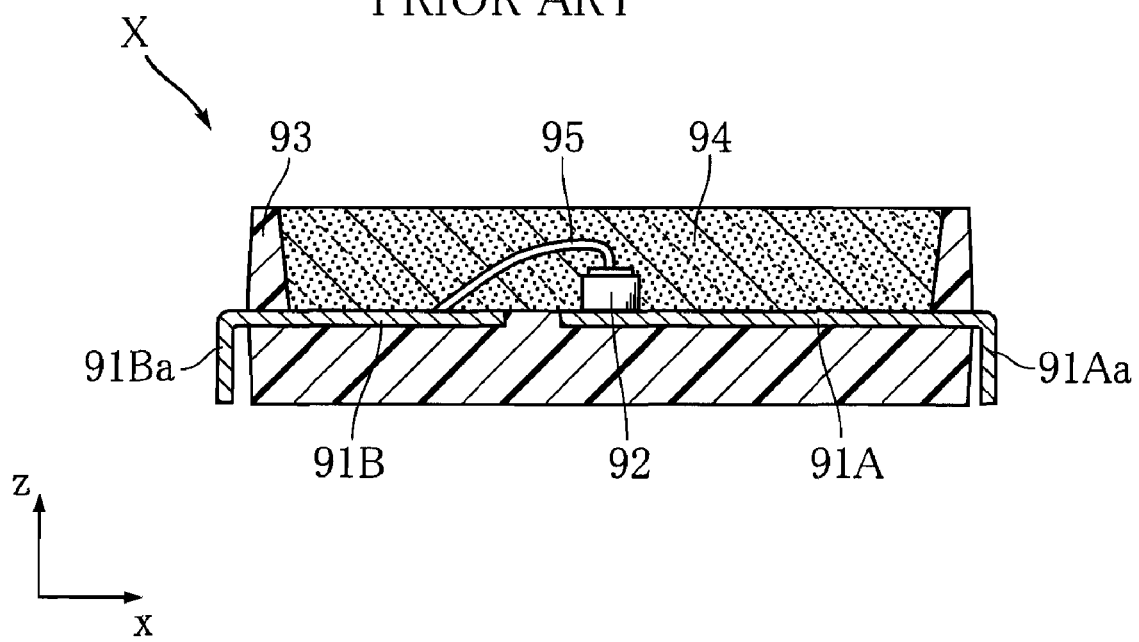
FIG. 9 is a sectional view taken along lines IX-IX in FIG. 8.

FIGS. 6 and 7 show a semiconductor light emitting module according to a second embodiment of the present invention.

In these figures, the elements which are identical or similar to those of the foregoing embodiment are designated by the same reference signs as those used for the foregoing embodiment. In the semiconductor light emitting module A2 of this embodiment, the ratio of the dimension in the y direction to the dimension in the x direction is considerably smaller than that of the semiconductor light emitting module A1 of the foregoing embodiment. Further, unlike the foregoing embodiment, the semiconductor light emitting module A2 does not include a zener diode.

In this embodiment, the space 51 includes a wider portion 51a and two narrower portions 51b. The wider portion 51a is located at the center of the space 51 in the x direction and accommodates the LED chip 2. The two narrower portions 51b sandwiches the wider portion 51a in the x direction. The dimension of the narrower portions 51b in the y direction is smaller than that of the wider portion 51a. The center of the wider portion 51a in the y direction is deviated from the center of the two narrower portions 51b toward the mounting terminals 15A, 15B side. To provide the space 51 having this configuration, the portion of the case 5 near the center in the x direction bulges outward on the mounting terminals 15A, 15B side, thereby having a non-flat side surface. The side surface of the case 5 which is on the opposite side of the mounting terminals 15A, 15B is flat.

The case 5 includes a placing surface 53. The placing surface is located between the lead 1A and the lead 1B in the x direction and flush with the mounting terminals 15A and 15B. As shown in FIG. 7, the placing surface 53 is located on the light emission side in the z direction relative to the mounting terminals 15A and 15B.

With this arrangement, the dimension of the semiconductor light emitting module A1 in the y direction is reduced. Meanwhile, owing to the provision of the wider portion 51a, the LED chip 2 is arranged properly, and the wire 4 is bonded without undesirable contact with other parts. Further, in mounting the semiconductor light emitting module A2 on the circuit board 7 by soldering, the placing surface 53 comes into contact with the circuit board 7, so that the semiconductor light emitting module A2 is held stably. Thus, the semiconductor light emitting module A2 is prevented from falling over.

The semiconductor light emitting module and the manufacturing method according to the present invention are not limited to the foregoing embodiments. The specific structure of the semiconductor light emitting module and the manufacturing method may be varied in design in many ways.

The invention claimed is:

1. A semiconductor light emitting module comprising:
a semiconductor light emitting element;
a first lead including a first die bonding pad to which the semiconductor light emitting element is attached;
a second lead spaced from the first lead in a first direction contained in a plane of the first die bonding pad, the second lead including a wire bonding pad connected to the semiconductor light emitting element via a wire; and
a case formed with a space elongated in the first direction and accommodating the semiconductor light emitting element;
wherein the first lead is provided with an extension extending from the first die bonding pad and with a mounting terminal connected to the extension, at least a portion of the extension projecting from the first die bonding pad in a second direction perpendicular to the first direction and being contained in the plane of the first die bonding pad, the mounting terminal extending perpendicularly to the second direction, and wherein the extension overlaps the semiconductor light emitting element in the first direction.

2. The semiconductor light emitting module according to claim 1, further comprising a zener diode, wherein the first lead includes a second die bonding pad extending from the first die bonding pad in the first direction toward the second lead and located at a position deviated toward an end of the space in the second direction, the zener diode being attached to the second die bonding pad,
   wherein the wire bonding pad of the second lead is located at a position deviated toward another end of the space in the second direction and overlaps the second die bonding pad in the first direction.

3. The semiconductor light emitting module according to claim 1, further comprising a plating layer covering an end surface of the mounting terminal and having a higher solder wettability than the mounting terminal, wherein the end surface of the mounting terminal faces in a third direction perpendicular to both the first direction and the second direction.

4. The semiconductor light emitting module according to claim 1, wherein the case includes a holding surface opposite to the mounting terminal in the second direction and extending in parallel with the mounting terminal.

5. The semiconductor light emitting module according to claim 1, wherein the space includes a wider portion accommodating the semiconductor light emitting element and two narrower portions sandwiching the wider portion in the first direction, the narrower portions being smaller than the wider portion in dimension in the second direction,
   wherein a portion of the case on the mounting terminal side has a non-flat side surface defining the wider portion and the two narrower portions, whereas a portion of the case on the opposite side of the mounting terminal in the second direction has a flat surface.

6. The semiconductor light emitting module according to claim 1, wherein the case includes a placing surface offset in the first direction toward the second lead relative to the mounting terminal, the placing surface being flush with the mounting terminal.

7. A method for manufacturing a semiconductor light emitting module, the method comprising:
   preparing a lead frame extending in a first direction and a second direction perpendicular to the first direction, the lead frame including a die bonding pad for bonding a semiconductor light emitting element, an extension extending from the die bonding pad in the second direction, a mounting terminal connected to the extension, and a frame portion to which the mounting terminal is connected via a connecting portion smaller than the mounting terminal in dimension in the first direction;
   plating the lead frame with a material having a higher solder wettability than the lead frame;
   bonding a semiconductor light emitting element on the die bonding pad at a position overlapping the extension in the first direction;
   forming a case including a space that is elongated in the first direction and accommodates the semiconductor light emitting element;
   cutting the connecting portion; and
   bending the extension so that the mounting terminal extends perpendicularly to the second direction.

8. The semiconductor light emitting module according to claim 1, wherein the light emitting element is positioned at a central portion of the case in the first direction.

9. The semiconductor light emitting module according to claim 1, wherein the wire is bonded to the wire bonding pad at a bonding position that is located farther from the mounting terminal than the light emitting element is from the mounting terminal.

10. The semiconductor light emitting module according to claim 1, wherein the first lead is further provided with an additional extension extending from the first die bonding pad and spaced from the first-mentioned extension in the first direction via a cutout, the additional extension extending in the second direction and contained in the plane of the first die bonding pad.

11. The semiconductor light emitting module according to claim 1, wherein the case includes a projection projecting toward a mounting surface on which the mounting terminal is mounted.

* * * * *